(12) United States Patent
Brueck et al.

(10) Patent No.: US 8,908,724 B1
(45) Date of Patent: Dec. 9, 2014

(54) METHOD AND APPARATUS FOR FABRICATION OF CONTROLLED CHIRP GRATINGS

(71) Applicants: Steven R. J. Brueck, Albuquerque, NM (US); Xiang He, Albuquerque, NM (US); Steve Benoit, Laporte, CO (US)

(72) Inventors: Steven R. J. Brueck, Albuquerque, NM (US); Xiang He, Albuquerque, NM (US); Steve Benoit, Laporte, CO (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 13/843,332

(22) Filed: Mar. 15, 2013

Related U.S. Application Data

(60) Provisional application No. 61/642,403, filed on May 3, 2012.

(51) Int. Cl.
*H01S 3/10* (2006.01)
*G02B 27/09* (2006.01)
*H01S 5/06* (2006.01)

(52) U.S. Cl.
CPC ............ *G02B 27/0927* (2013.01); *H01S 5/06* (2013.01)
USPC ........................................................ 372/20

(58) Field of Classification Search
CPC ............ H01S 5/141; H01S 3/10; H01S 5/06; G02B 27/0927

USPC ................. 372/20, 50.11, 96, 29.01
See application file for complete search history.

(56) References Cited

U.S. PATENT DOCUMENTS

| | | | | |
|---|---|---|---|---|
| 7,656,912 | B2 * | 2/2010 | Brueck et al. | 372/20 |
| 8,144,739 | B2 * | 3/2012 | Figueroa et al. | 372/25 |
| 2003/0007523 | A1 * | 1/2003 | Chapman et al. | 372/20 |
| 2012/0314990 | A1 * | 12/2012 | Pitwon | 385/14 |

* cited by examiner

*Primary Examiner* — Tuan Nguyen
(74) *Attorney, Agent, or Firm* — MH2 Technology Law Group, LLP

(57) ABSTRACT

In some aspects of the present application, an apparatus for producing an interference pattern on a photosensitive portion formed on a surface of a sample is disclosed. The apparatus can include an optical system for providing interference between two coherent spherical wavefronts impinging on a thin-film photosensitive material formed on a surface of a sample, wherein a plane of the surface normal of the sample is arranged at an angle with respect to a plane defined by center propagation vectors of the two coherent spherical wavefronts; and one or more actuating elements operable to actuate one or more optical elements in the optical system, the sample, or both the one or more optical elements and the sample in one or more degrees of freedom to control a relative magnitude of a longitudinal and a transverse chirp of the interference pattern.

14 Claims, 18 Drawing Sheets

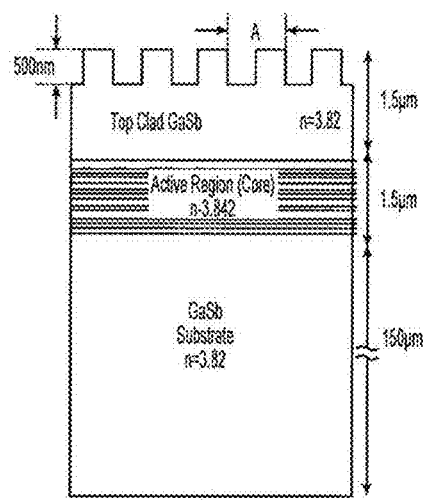 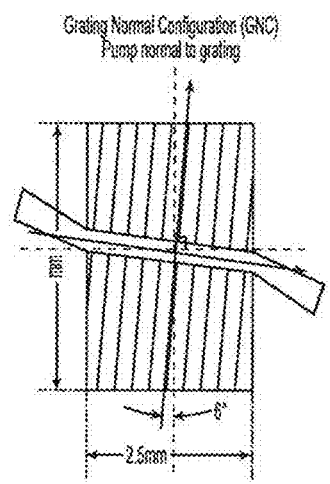
*Fig. 9A*  *Fig. 9B*

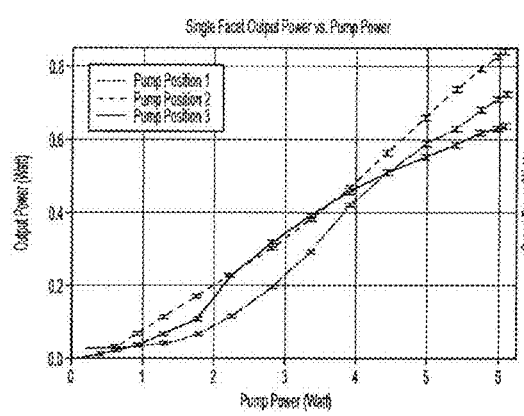 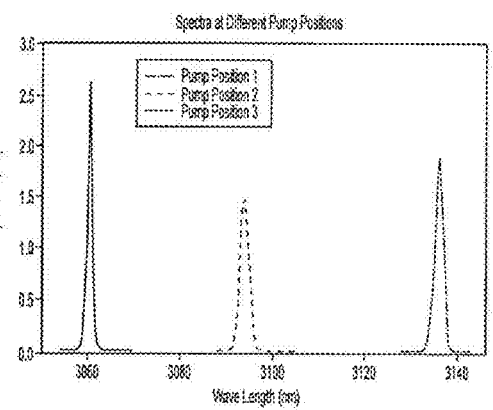
*Fig. 17A*   *Fig. 17B*

US 8,908,724 B1

METHOD AND APPARATUS FOR FABRICATION OF CONTROLLED CHIRP GRATINGS

CROSS REFERENCE TO RELATED APPLICATIONS

This application claims priority to U.S. Provisional Patent Application Ser. No. 61/642,403 filed on May 3, 2012, the disclosure of which is incorporated by reference herein in its entirety.

GOVERNMENT INTEREST

This invention was made with U.S. Government support under Grant No. DTRA 01-03-D-0009 (task order 26) awarded by the Defense Threat Reduction Agency and Grant No. AFOSR FA9550-10-1-0517 awarded by the Air Force Office of Scientific Research. The U.S. Government has certain rights in the invention.

FIELD OF THE DISCLOSURE

The present application is directed to systems and methods for fabricating a chirped grating for various optical elements. A specific example is a tunable distributed feedback (DFB) laser wherein the tuning is affected by optically pumping a strip across different regions of the chirped grating.

BACKGROUND

Many of the one-dimensional gratings used in optics have a more or less constant pitch across the two-dimensional surface area of the grating. This is true, for example, for the diffraction gratings used for in spectrometers and monochromators and for the gratings used in most distributed feedback (DFB) and distributed Bragg reflector (DBR) laser structures. For the spectroscopic application, the angular dependence of the scattering from the grating is described by the familiar grating equation: $\sin \theta_{out} = \sin \theta_{in} + i\lambda/d$ where $\lambda$ is the optical wavelength, d is the (nominally constant) period of the grating teeth, i $(=0, \pm 1, \pm 2, \ldots)$ is an integer and $\theta_{in}$ ($\theta_{out}$) is the incident (scattered) angle measured from the normal to the grating. Here it is assumed that the angles of incidence and scattering are in a plane perpendicular to the grating lines. For the laser application, the Bragg condition, $n_1 d_1 + n_2 d_2 = \lambda/2$, where $n_1$ ($n_2$) is the modal refractive index of the laser structure under medium 1(2) and $d_1$ ($d_2$) is the thickness of medium 1(2), determines the lasing wavelength.

For the case of DFB and DBR lasers, the grating period is usually nominally constant along the lasing direction (across the entire laser cavity for DFB, just at the ends for DBR). There have been reports of longitudinal chirps to improve the resistance of the laser to hole-burning stabilities at high operating powers [P. Zhou and G. S. Lee, "Phaseshifted distributed feedback laser with linearly chirped grating for narrow linewidth and highpower operation," Appl. Phys. Lett. 58, 331-333 (1991)], which is herein incorporated by reference.

A large tunable range for a chirped grating on a large-area, optically-pumped semiconductor laser structure has been recently demonstrated where the pump stripe was shifted relative to the chirped grating to provide the tuning mechanism. This was primarily a transverse chirp (e.g. the grating lines are splayed so that the spacing between adjacent grating lines changes as the grating is sampled along the lines. For longitudinal chirp, the spacing varies across a single line. The distinction between longitudinal and transverse chirp is illustrated schematically as prior art in FIG. 1.

FIG. 2 shows a prior art grating fabrication method of U.S. Pat. No. 7,656,912, which is commonly owned by the present assignee and that has an inevitable mixture of both transverse chirp (desirable for tuning) and longitudinal chirp (undesirable if the chirp is large enough so that the entire length of the pumped area cannot contribute to the lasing). In the optical scheme of FIG. 2, once the positions of the lens and the sample and the lens focal length are determined, both the longitudinal and the transverse chirps are fixed by the optical configuration. In FIG. 2, a coherent radiation source, for example a laser operable to produce radiation at 355 nm, directs radiation to a simple lens system 310, 320, and 330 that is used to control the wavefronts, e.g., to form a large area plane wave and to split that single large area plane wave into two symmetric smaller-area spherical waves. These waves are then incident on a photoresist coated sample wherein the interference between the two spherical waves is recorded in the photoresist by interferometric lithography. The interference between the two coherent spherical waves can produce a periodic spatially-varying intensity pattern. Such pattern can be transferred into, e.g., a top clad layer of a quantum well laser structure and thus form the plurality of grating lines in the semiconductor by an etching step. It is noted that the interference between two spherical waves produces both a transverse chirp (e.g. the grating lines are splayed relative to a single frequency grating) and a longitudinal chirp (the spacing between grating lines varies in a direction nominally perpendicular to the grating lines).

Therefore, a purpose of the current invention is to provide a method and apparatus for fabrication of a chirped grating wherein the longitudinal and transverse chirps can be independently controlled, at least over some range. In particular the goal is to reduce the longitudinal chirp for a fixed transverse chirp.

SUMMARY

In implementations, an apparatus for producing an interference pattern on a photosensitive portion formed on a surface of a sample is disclosed. The apparatus can comprise an optical system for providing interference between two coherent spherical wavefronts impinging on a thin-film photosensitive material formed on a surface of a sample, wherein a plane of the surface normal of the sample is arranged at an angle with respect to a plane defined by center propagation vectors of the two coherent spherical wavefronts; and one or more actuating elements operable to actuate one or more optical elements in the optical system, the sample, or both the one or more optical elements and the sample in one or more degrees of freedom to control a relative magnitude of a longitudinal and a transverse chirp of the interference pattern.

In implementations, the optical system can comprise a laser with an output beam characterized by both a longitudinal and a transverse coherence; one or more optical elements operable to expand and approximately collimate the output beam of the laser, wherein a first portion of the output beam of the laser that has been expanded and collimated is incident on a first optical element of the one or more optical elements and is redirected therefrom as a first plane wave to a second optical element of the one or more optical elements at an first angle of incidence, wherein a second portion of the output beam of the laser that has been expanded and collimated is incident on the second optical element of the one or more optical elements as a second plane wave at a second angle of incidence, wherein the second optical element of the one or more optical elements is the final optical element and is operable to convert the first and the second plane waves into two spherical waves, wherein a center portion of each spherical wave is propagating in a same direction as the first and the second plane waves, wherein the two spherical waves interfere coherently to expose a pattern in the thin-film photosensitive material on the surface of the sample, wherein the surface normal of the sample is arranged at an angle with respect to a plane defined by the center propagation vectors of the two coherent spherical wavefronts, wherein the interference pattern that has been exposed is characterized by a longitudinal and a transverse chirp, and wherein the relative magnitudes of the longitudinal and transverse chirp can be controlled by adjusting the positions and tilts of the one or more optical elements and the sample.

In implementations, the second optical element can comprise a lens comprising a spherical lens or a cylindrical lens.

In implementations, the apparatus can further comprise a supporting structure operable to support the first optical element, the second optical element and the sample.

In implementations, the supporting structure can comprise one or more actuating elements to adjust the first optical element, the second optical element and the sample in one or more degrees of freedom.

In implementations, the apparatus can further comprise a filter arranged between the second optical element and the sample. The filter can comprises a graded intensity filter operable to compensate for changes in intensity of the output beam produced by the laser and the one or more optical elements.

In implementations, a method of imaging an interference pattern on a photosensitive portion formed on a surface of a sample is disclosed. The method can comprise arranging an optical system for providing interference between two coherent spherical wavefronts impinging on a thin-film photosensitive material formed on a surface of a sample, wherein a normal to a plane of the surface of the sample is arranged at an angle with respect to a plane defined by center propagation vectors of the two coherent spherical wavefronts; and controlling one or more actuating elements to actuate one or more optical elements in the optical system, the sample, or both the one or more optical elements and the sample in one or more degrees of freedom to control a relative magnitude of a longitudinal and a transverse chirp of the interference pattern.

In implementations, the arranging the optical system can comprise providing a laser with an output beam characterized by both a longitudinal and a transverse coherence; expanding and collimating the output beam of the laser using one or more optical elements, wherein a first portion of the output beam of the laser that has been expanded and collimated is incident on a first optical element of the one or more optical elements and is redirected therefrom as a first plane wave to a second optical element of the one or more optical elements at an first angle of incidence, wherein a second portion of the output beam of the laser that has been expanded and collimated is incident on the second optical element of the one or more optical elements as a second plane wave at a second angle of incidence, wherein the second optical element of the one or more optical elements is the final optical element and is operable to convert the first and the second plane waves into two spherical waves, wherein a center portion of each spherical wave is propagating in a same direction as the first and the second plane waves, wherein the two spherical waves interfere coherently to expose a pattern in the thin-film photosensitive material on the surface of the sample, wherein the surface normal of the sample is arranged at an angle with respect to a plane defined by center propagation vectors of the two coherent spherical wavefronts, wherein the interference pattern that has been exposed is characterized by a longitudinal and a transverse chirp, and wherein the relative magnitudes of the longitudinal and transverse chirp can be controlled by adjusting positions and tilts of the one or more optical elements and the sample.

In implementations, the method can further comprise providing a supporting structure to support the first optical element, the second optical element, and the sample.

In implementations, the method further comprise providing a filter between the second optical element and the sample, wherein the filter comprises a graded intensity filter operable to compensate for changes in intensity of the output beam produced by the laser.

In implementations, the laser can comprise a frequency tripled Nd:YAG laser.

In implementations, a device can be formed by the method, wherein the device can comprise an optically pumped, tunable mid-IR laser based on type II-InAS:GaSb material.

In implementations, a tunable laser device is disclosed. The device can comprise a chirped distributed feedback (DFB) grating disposed on an optically pumped laser structure, wherein the chirped DFB comprises a grating pitch that varies across the structure and is characterized by both longitudinal and transverse chirp parameters; and a pump laser disposed to provide a pump beam illumination in a sub-area with respect to an area covered by the chirped DFB grating, the position being changed to allow a continuous tuning of a lasing emission wavelength from the optically pumped laser structure.

In implementations, the pump beam illumination can be arranged in a stripe geometry with the long axis of the stripe essentially perpendicular to the lines of the grating on the sample.

In implementations, the grating lines of the chirped DFB grating can be arranged at a tilt to one or more edges of the optically pumped laser structure to reduce an impact of any Fabry-Perot resonances on the lasing emission.

In implementations, the chirped DFB grating can be formed by etching into a material of a clad layer of the optically pumped laser structure, wherein the material comprises one or more of Ge, GaSb, AlGaSb, AlAsSb, AlGaAsSb, InAlAsSb, GaAlAsSb, AlSb, AlInSb, AlSbAs, or AlGaSbAs.

In implementations, the chirped DFB grating can be formed by an interferometric lithography technique.

In implementations, the chirped DFB grating can comprise a continuously-varying grating period.

In implementations, the device can further comprise a discrete set of DFB gratings that each DFB grating comprises a fixed grating period and the chirp is realized in different fixed grating periods.

In implementations, the optically pumped laser structure can employ one or more type-II quantum well active regions in the GaSb/InAs or related material system such that the material optical gain is in the mid-infrared spectral region. The related material systems can include systems where the InAs is replaced by InGaAs or other ternary compound and similarly the GaSb is replaced with ternary compound such as InGaSb.

In implementations, an apparatus for producing an interference pattern on a photosensitive portion formed on a surface of a sample is disclosed. The apparatus can comprise a first optical element arranged to receive a first coherent portion of radiation from a radiation source and to convey the first portion of radiation to a second optical element; the second optical element arranged to receive a second coherent portion of radiation from the radiation source and to receive the first portion of radiation conveyed by the first optical element, wherein the first portion and the second portion are received as plane waves from the radiation source, and wherein the second optical element is operable to convert the plane waves into spherical waves with contracting wavefronts towards a focal plane of the second optical element; and the photosensitive portion formed on the surface of the sample arranged to receive the contracting wavefronts to be recorded as the interference pattern, wherein the plane of the photosensitive portion is arranged at an angle with respect to optical axis of the second optical element.

In implementations, the first optical element comprises a flat reflective surface and the second optical element comprises a spherical lens and/or cylindrical lens, for example, a plano-convex lens.

In implementations, the apparatus can comprise a supporting structure operate to support the first optical element, the second optical element, or both the first and the second optical element. The supporting structure can comprise one or more actuating elements operable to move the supporting structure in one or more degrees of freedom.

In implementations, the apparatus can comprise a sample supporting structure operable to support the sample. The sample supporting structure can comprise one or more actuating elements operable to move the sample supporting structure in one or more degrees of freedom.

In implementations, the apparatus can comprise a filter arranged between the second optical element and the sample. The filter can comprise a graded intensity filter operable to compensate for changes in intensity of the radiation produced by the radiation source and the optical elements.

In implementations, the interference pattern can be chirped in one or more directions and the relative transverse and longitudinal chirps are controllable over some ranges by adjusting the positions and tilts of the optical elements and the sample.

In implementations, a method of imaging an interference pattern on a photosensitive portion formed on a surface of a sample is disclosed. The method can comprise arranging a first optical element to receive a first portion of radiation from a radiation source; providing the first portion of radiation to a second optical element; arranging the second optical element to receive a second portion of radiation from the radiation source; receiving the first portion of radiation provided by the first optical element, wherein the first portion and the second portion are received as nominal plane waves from the radiation source, and wherein the second optical element is operable to convert the planes waves into spherical waves with contracting wavefronts propagating towards a focal plane of the second optical element; and arranging the photosensitive portion formed on the surface of the sample to receive the contracting wavefronts to be recorded as the interface pattern, wherein the normal to the photosensitive portion is arranged at an angle with respect to the optical axis of the second optical element.

In implementations, the first optical element can comprise a flat reflective surface and the second optical element can comprise a spherical lens or a cylindrical lens, for example, a plano-convex lens.

In implementations, the method can comprise providing a supporting structure to support the first optical element, the second optical element, or both the first and the second optical element.

In implementations, the method can comprise actuating the supporting structure using one or more actuating elements to move the supporting structure in one or more degrees of freedom.

In implementations, the method can comprise providing a sample supporting structure operable to support the sample.

In implementations, the method can comprise actuating the sample supporting structure using one or more actuating elements to move the sample supporting structure in one or more degrees of freedom.

In implementations, the method can comprise providing a filter between the second optical element and the sample. The filter can comprise a graded intensity filter operable to compensate for changes in intensity of the radiation produced by the radiation source.

In implementations, the interference pattern can be chirped in one or more directions.

In implementations, the method can comprise forming an optically pumped laser using the interference pattern formed on the sample as an active region for the laser.

In implementations, the method can comprise adjusting the position of the sample relative to the second optical element to provided control of a longitudinal and a transverse chirp of the interference pattern over a two-dimensional exposure area.

In implementations, the laser is based on type-II InAs: GaSb active regions.

In implementations, the radiation source comprises a frequency tripled Nd:YAG laser.

In implementations, the radiation provided by the radiation source comprises a 355 nm $3^{rd}$ harmonic from a Nd:YAG laser.

In implementations, a device is formed by the method, wherein the device comprises an optically pumped, tunable mid-IR laser based on type II-InAS:GaSb material.

In implementations, a tunable laser device is disclosed that comprises a chirped distributed feedback (DFB) grating disposed on an optically pumped laser structure, wherein the chirped DFB comprises a grating pitch that varies across the structure and is characterized by both longitudinal and transverse parameters; and a pump laser disposed to provide a pump beam illumination in a sub-area with respect to an area covered by the chirped DFB grating, the position being changed to allow a continuous tuning of a lasing emission wavelength from the optically pumped laser structure.

In implementations, the chirped DFB grating provides a feedback essentially perpendicular to grating lines of the chirped DFB grating while the transverse chirp is principally arranged in a direction parallel to the grating lines of the chirped grating DFB grating.

In implementations, the grating lines of the chirped DFB grating are arranged at a tilt to one or more edges of the optically pumped laser structure to reduce an impact of any Fabry-Perot resonances on the lasing emission.

In implementations, the chirped DFB grating provides a feedback essentially perpendicular to grating lines of the chirped DFB grating while a chirp is principally arranged in a direction perpendicular to the grating lines of the chirped DFB grating.

In implementations, the chirped DFB grating further comprises a grating period adjusted to provide the feedback and to provide an output coupling normal to the plane of the chirped DFB grating.

In implementations, the pump beam is provided from a top side of the optically pumped laser structure that is through the chirped DFB grating or from a bottom side of the optically pumped laser structure that is opposite the chirped DFB grating.

In implementations, the chirped DFB grating is formed by etching into a material of a clad layer of the optically pumped laser structure, wherein the material comprises one or more of GaSb, AlGaSb, AlAsSb, AlGaAsSb, InAlAsSb, GaAlAsSb, AlSb, AlInSb, AlSbAs, or AlGaSbAs.

In implementations, the chirped DFB grating is formed by an interferometric lithography technique.

In implementations, the chirped DFB grating comprises a continuously-varying grating period.

In implementations, the device further comprising a discrete set of DFB gratings that each DFB grating comprises a fixed grating period and the chirp is realized in different fixed grating periods.

In implementations, the optically pumped laser structure employs one or more type-II quantum well active regions such that the material optical gain is in the mid-infrared spectral region.

BRIEF DESCRIPTION OF THE DRAWINGS

FIGS. 9A and 9B show an example device configurations having the gratings produced by the arrangement of FIGS. 4 and 5.

FIG. 17A shows single facet output power of DFB laser at different pump positions. FIG. 17B shows a plot of the spectra at these three different pump positions.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1:
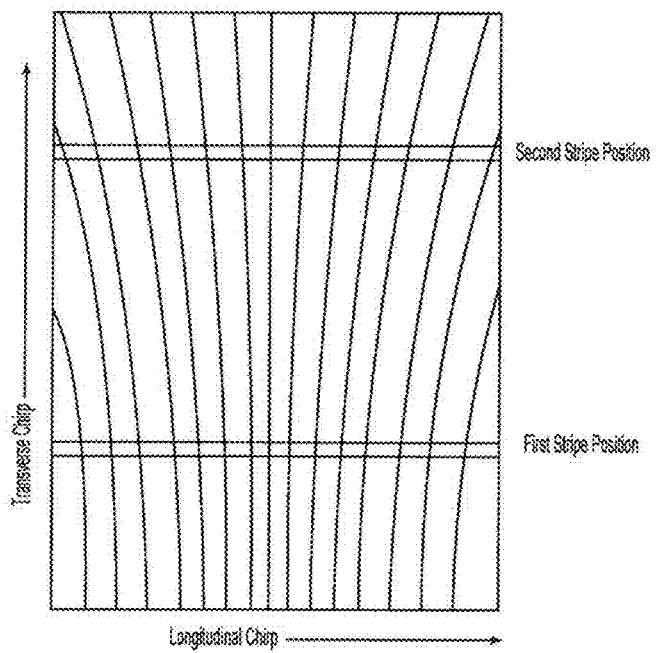
FIG. 1 illustrates prior art longitudinal and transverse chirp directions for a 2D grating structure.
Figure 2:
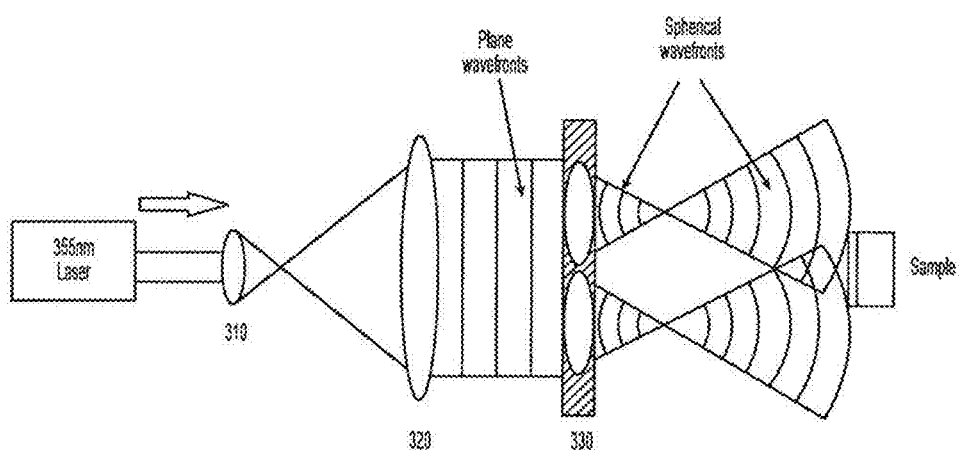
FIG. 2 shows the prior art method of fabrication of a chirped grating.

Based on laser experimental results, it has been shown that the chirp has a strong effect on the lasing behavior. From an applications standpoint, the largest chirp obtainable is desired so that the largest possible tuning range on a single laser chip can be achieved. On the other hand, as the chirp increases the local, position dependent, reflection parameters of the grating also shift and there can be a loss of reflectance as the local reflection band is shifted away from the lasing wavelength; this is a consequence of the longitudinal chirp of the grating. In addition, the tilt of the grating facets across the laser stripe, associated with the transverse chirp, can result in an additional loss. Based on the experimental lasing results and on the modeling, the first effect, e.g. the shift of the local reflection band with position, is the dominant limitation using a grating produced by the prior art optical configuration, as shown in FIG. 2.

Figure 3:
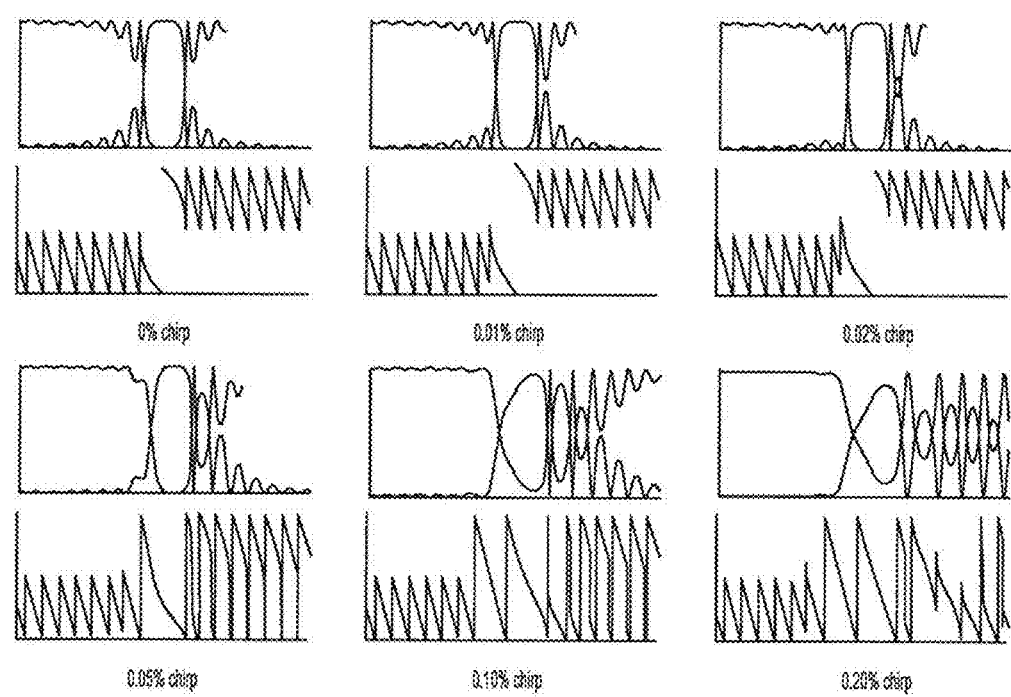
FIG. 3 shows the transmission and reflection properties of gratings with a parabolic chirp.

The transmission and reflection properties of gratings with a parabolic chirp, which approximates the actual device chirp, are such that increasing chirp decreases the stopband depth, increases the depth of adjacent lobes, and alters the reflected phase. The general behavior as the chirp is increased is shown in FIG. 3, which shows reflectance amplitude and phase as the grating chirp is increased. A parabolic variation in the grating pitch is assumed. In implementations, the IL process in accordance with the prior art teachings can produce a grating on the sample that is chirped in both the transverse and the longitudinal directions. The transverse chirp (grating period varies in the direction of the grating lines) provides for wavelength tuning. However, the longitudinal chirp (grating period varies in the direction perpendicular to the grating lines—this is also the laser cavity direction) impacts the width of the pump strip that can contribute to the lasing. The longitudinal chirp can lead to mode jumps as the laser strip is moved along the transverse direction and limits the continuous tuning range. It is therefore a goal of the present invention to develop IL configurations wherein the longitudinal chirp is minimized for a fixed transverse chirp.

Figure 4:
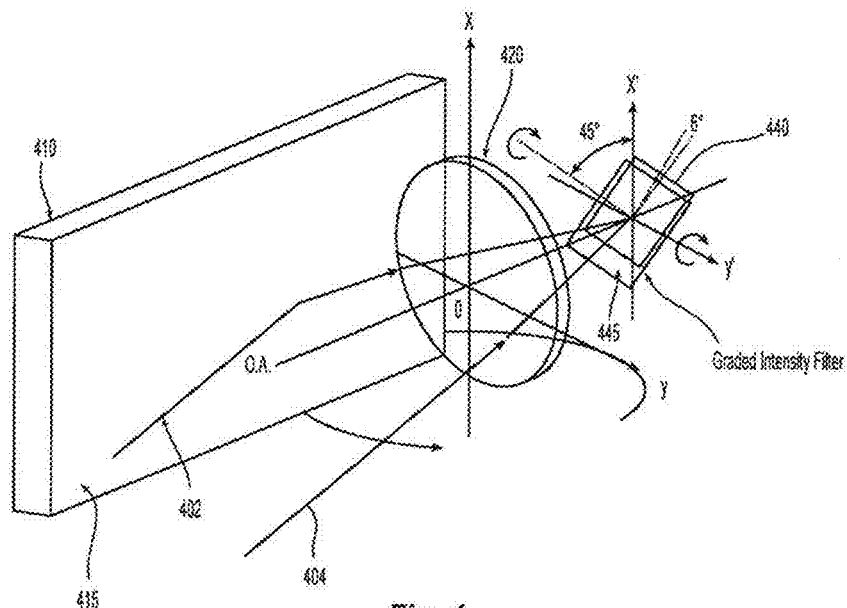
FIG. 4 shows an example IL arrangement in accordance with the present teachings.
Figure 5:
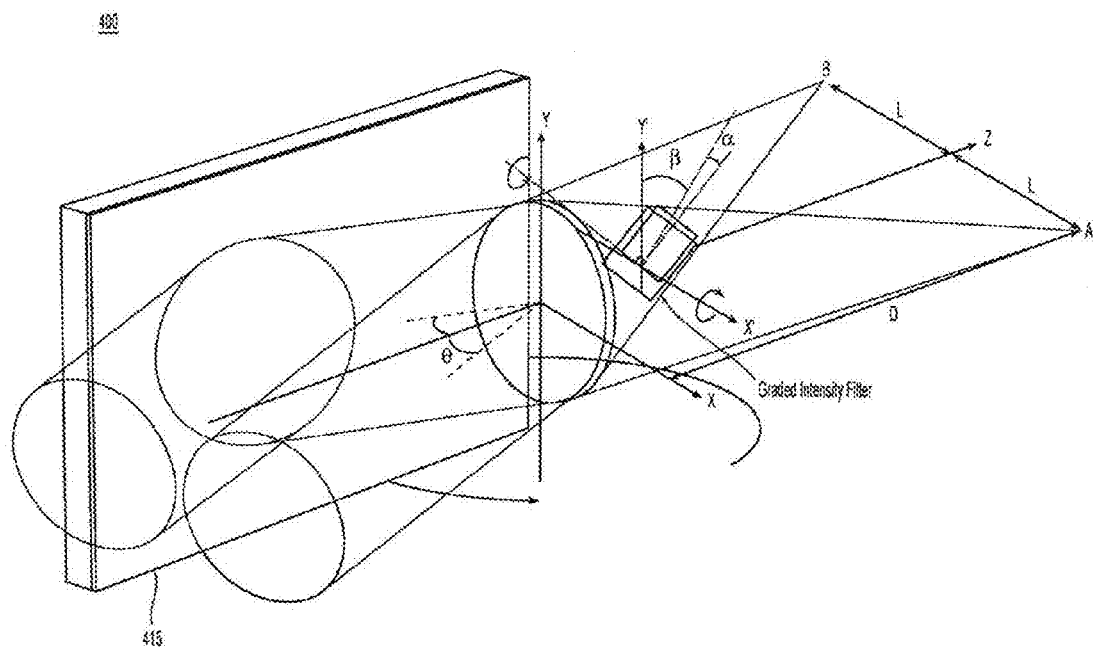
FIG. 5 shows another view of the arrangement of FIG. 4.

In implementations, reduction of the longitudinal device chirp while preserving lateral chirp can be achieved by using an interference lithography (IL) arrangement with a cylindrical and/or spherical lens, a tilted sample relative to the back surface of the lens (tilt angle indicated by β in FIGS. 4 and 5, where the tilted sample is positioned at a distance from the optical axis of the lens. This arrangement can produce a device that has a target tuning range while providing continuous tuning without mode hops. In implementations, the photoresist coated portion of the sample can be tilted with respect to the back surface of the lens. For example, the sample can be tilted by about 45° by rotating around the optic axis and rotated counterclockwise by about 6° azimuthally around a normal for the sample as shown in FIGS. 4 and 5 below. Additionally, the sample can be positioned relative to the OA of the lens to optimize the chirp pattern for specific requirements.

FIG. 4 is an example IL arrangement 400 for imaging a chirped grating pattern onto a substrate with a ray trace perspective in accordance with the present teachings. FIG. 5 shows a similar view to that shown in FIG. 4, with the addition of showing bundle of radiation perspective along with showing the geometric relationship of the various components in the arrangement. While FIGS. 4 and 5 illustrate various components contained in arrangement 400, one skilled in the art will realize that these components are exemplary and that arrangement 400 can include additional optical and/or mechanical components in accordance with the present teachings. Moreover, arrangement 400 can include various types of optical components, such as refractive, reflective, magnetic, electromagnetic, electrostatic or other types of optical components, or any combination thereof, for directing, shaping, or controlling radiation.

As depicted in FIG. 4, the IL arrangement 400 is shown with the aid of a first three-dimensional coordinate system (x, y, z) tied to the lens 420 and a second coordinate system (x', y', z') tied to the sample and tilted about the y (=y') axis, where the optical axis (OA) of optical element 420 is along the z-axis direction. A coherent radiation source (not shown) is arranged to produce radiation in the form of a plane (or nearly plane) wave along the z-axis direction toward optical element 410 and optical element 420. By way of a non-limiting example, optical element 410 can comprise a flat plane mirror having a reflective surface 415 and optical element 420 can comprise a plano-convex lens. For the discussion that follows, optical element 410 will be referred to as a mirror and optical element 420 will be referred to as a lens. However, this labeling is not meant to limit the structure or composition of these elements. Other suitable individual or combination of optical components can be used for the optical elements 410 and 420 as is known in the art.

Figures 6A, 6B:
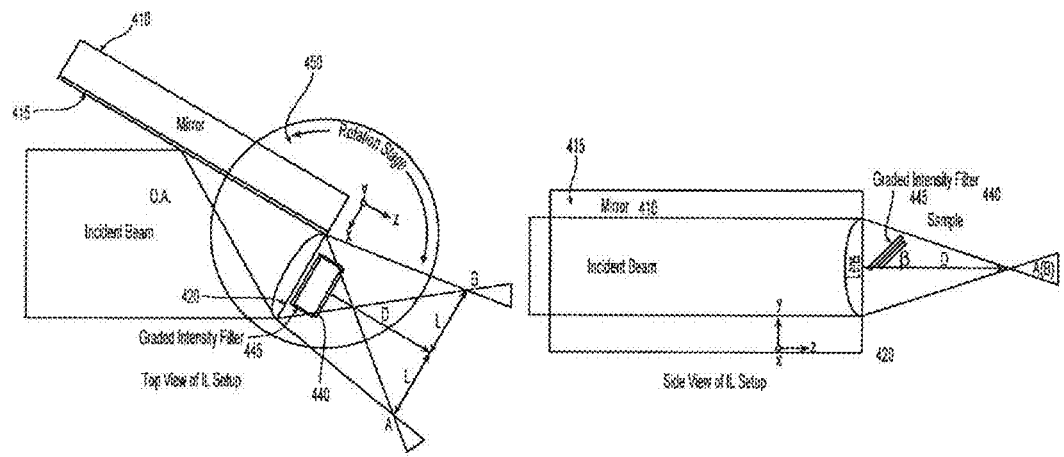
FIGS. 6A and 6B show a top and side view, respectively, of the arrangement of FIG. 5.
Figure 7A:
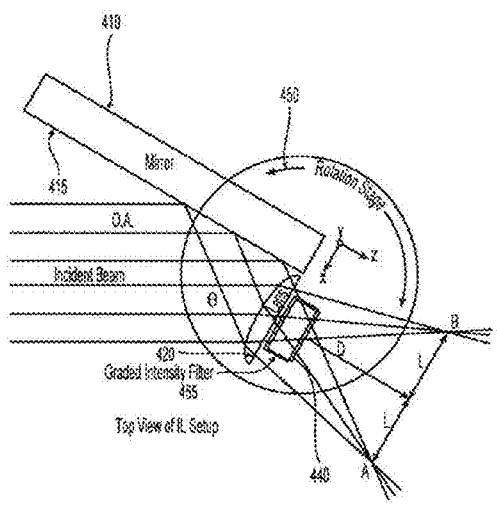
FIGS. 7A and 7B show a top and side view, respectively, of the arrangement of FIG. 4.

Mirror 410 and lens 420 can be held in position using a common support structure (e.g., rotation stage 450 shown in FIGS. 6a and 7a). Alternatively, separate support structures can be used. Support structure can be fixed or allow for movement of the mirror 410 and lens 420 individually or collectively by including one or more actuators that allow the mirror 410 and lens 420 to be moveable in one or more degrees of freedom. The one or more actuators can be controlled either manually or using a computer-controlled system (not shown). As shown in FIG. 5, mirror 410 and lens 420 are operable to be moveable about the x-axis, y-axis, or both the x- and y-axes. One or more alignment systems can also be coupled to the support structure to ensure proper alignment of the various components of arrangement 300.

In implementations, lens 420 can be arranged with respect to mirror 410 in such a manner that a plane along an entrance face 422 of lens 420 (along the y-axis as shown in FIG. 4) is perpendicular to a plane along the reflecting surface 415 of mirror 410 (along the z-axis). Mirror 410 and lens 420 are position such that radiation from the radiation source is divided evenly such that a portion of the radiation 402 is provided to mirror 410 and another portion of radiation 404 is provided to lens 320. Radiation reflected by reflecting surface 415 of mirror 410 is then directed onto and through lens 420. Lens 420 receives both portions of radiation 402 and 404, including the first portion 402 received indirectly from the radiation source by way of reflecting surface 415 of the mirror 410 and the second portion 404 received directly from the radiation source.

Substrate or sample 440 is shown in FIG. 4 in relation to the second reference system (x', y', z'). Sample 440 is positioned on the back side away from the entrance face 422 of the lens 420. A top surface of sample 440 can be pre-coated with a photosensitive resist or photoresist layer (not shown) and be arranged to receive the radiation from optical element 420. The photoresist layer is arranged away from the focal plane of the lens 420 so that the radiation impinges upon an area of the sample. Sample 440 can be supported by a support structure (not shown) that can be fixed or moveable in one or more degrees of freedom using one or more control or actuating elements (not shown). In the implementation where the sample 440 is moveable, the support structure may be controlled either manually or by a computer-controlled system. As shown in FIG. 4, the sample 440 can be rotated about the axis, the y-axis, or both the z'- and y-axes. For example, the sample 440 can be rotated by about 6° about the zx-axis and about 45° about the y'-axis. The sample 440 can be positioned and/or rotated by other suitable amounts depending on the particular type and/or arrangement of the radiation source and the number and type of optical components employed in arrangement 400 in order to properly produce an image onto the photoresist of the sample 440. In particular the rotation about the z' axis is chosen so that the grating lines and the laser stripe (perpendicular to the grating lines) are tilted relative to the cleaved edges of the sample to avoid Fabry-Perot cavity effects. The rotation about the y' axis and the placement of the sample relative to the optical centerline are the means by which the longitudinal and transverse chirps are adjusted for a given lens configuration. In FIGS. 4 and 5, the tilt about the y (=y') axis is the motion that reduces the longitudinal chirp; tilt about the z' axis eliminates the Fabry-Perot feedback from the cleaved facets.

In arrangement 400, with the wafer being tilted and a distance between lens 420 and sample 440 that varies for different parts of the sample surface, the radiation received by the photoresist on the sample 440 has a non-uniform intensity distribution across the sample. This can result in a variation of the line space ratio along the transverse chirp and can impact the DFB coupling constant and hence the laser performance. The non-uniform intensity can cause the line/space ratio of the grating pattern to vary. To compensate this intensity difference, filter 445 can be positioned between lens 420 and sample 440 and parallel to sample 420. Filter 445 can include one or more filters and can include, for example, a graded intensity filter that can make the optical intensity uniform across the whole area of sample. Filter 445 can be supported by a mounting device (not shown) can provide for actuation of filter 445. In the implementation that filter 445 is moveable, one or more controllers or actuators can be coupled to the mounting device allowing filter 445 to be movable in one or more degrees of freedom, for example, moveable about the z'-axis, the y'-axis, or both the z'-, and the y'-axes.

FIG. 5 shows a similar view as that shown in FIG. 4 with the addition of showing the radiation as a bundle of light and showing the geometric relationship among various components of arrangement 400. In implementations, the radiation source produces radiation in the form of a plane wave. Mirror 410 and lens 420 can be arranged such that radiation 402 and 404 is received at the lens 420 at an angle θ with respect to the OA. Lens 420, such as a plano-convex lens, can convert the two plane waves into spherical waves with contracting wavefronts towards the lens focus and focuses them to two focal points A and B respectively as shown in FIG. 4. With the geometric arrangement of FIGS. 4 and 5, focal points A and B will be separated by an equal distance L from the OA. In front of the two foci, these two converging spherical waves will interfere in the overlapped zone 450 behind lens 420. The chirped grating pattern from the interference of these two spherical waves will be recorded in a pre-coated photoresist (not shown) on sample 440.

Figure 7B:
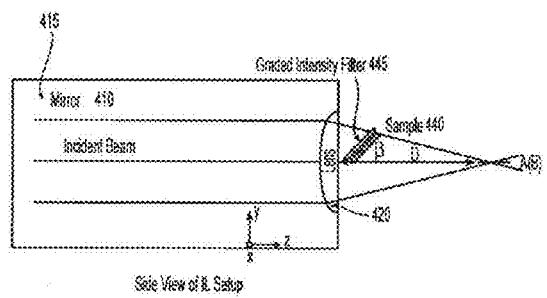

FIGS. 6a and 6b show a top view and a side view of the arrangement 400 of FIG. 4, respectively. FIGS. 7a and 7b show a top view and a side view of the arrangement 400 of FIG. 5, respectively. As shown in FIGS. 6a, 6b, 7a, and 7b, radiation source produces radiation such that a first portion 402 is received by mirror 410 and a second portion 404 is received by lens 420. The radiation source is positioned such that the radiation is received at an angle θ with respect to the OA of the lens 320. Support structure for the mirror 410 and lens 420 is shown as a rotation stage 450 that can rotate about the x-axis direction. To adjust the grating period imaged on the photoresist of the sample 440 according to the gain spectral peak of different wafers, the mirror 410 and lens 420 can be rotated relative to the direction of the impinging radiation to vary the incident angle θ of the interfering beams onto the sample.

Once the exposure is done, the rest of the processing to transfer the pattern into the wafer is a standard develop/etch process. Hard mask layers can be used to allow for deeper gratings.

Figure 8A:
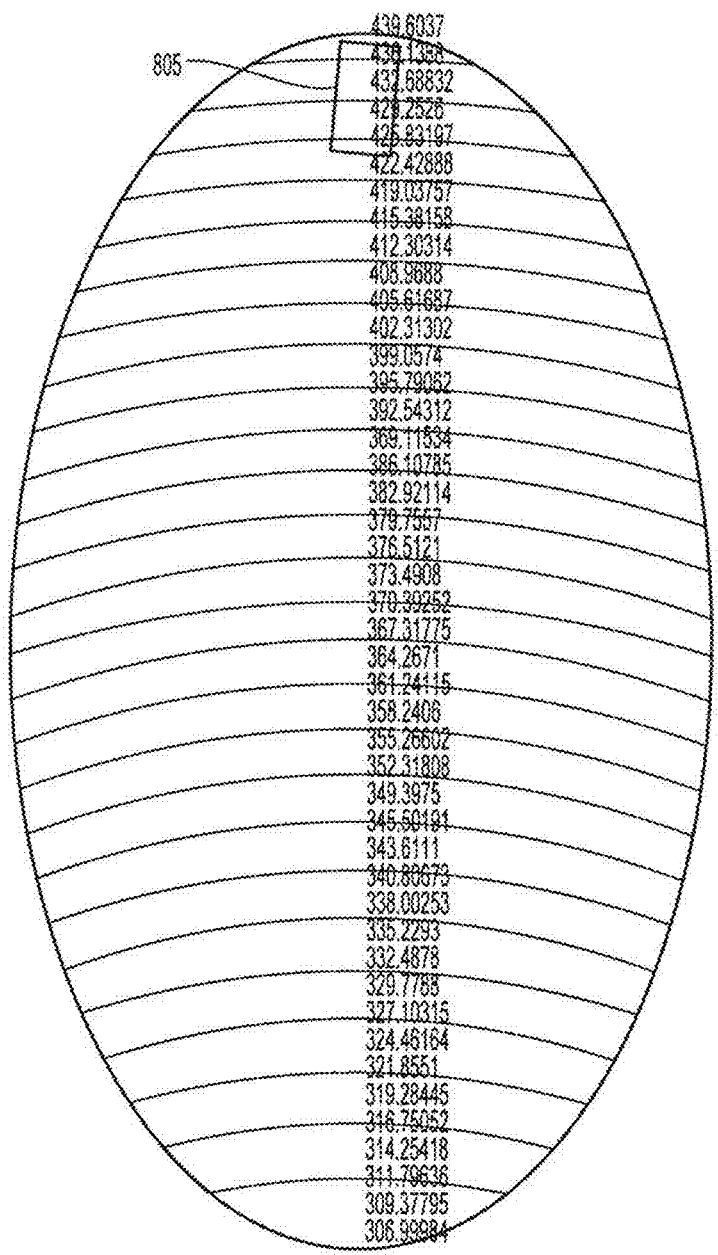
FIGS. 8A and 8B. show an example interference patterns produced using the arrangement of FIGS. 4 and 5.
Figure 8B:
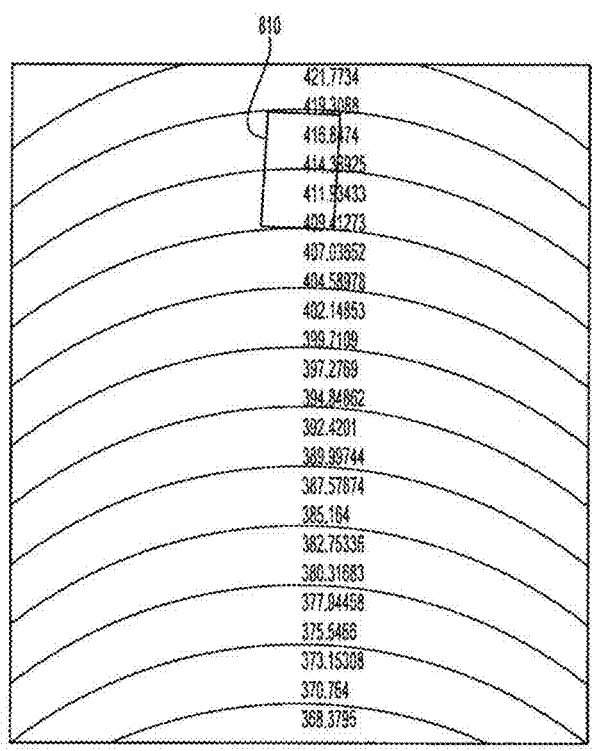

FIGS. 8A and 8B show examples of the interference pattern calculation for a sample placed at an angle behind both spherical and cylindrical lenses, respectively produced using the arrangement 400. The small rectangles 805 and 810 in FIGS. 8A and 8B, respectively, represent the position of the projection of the sample surface onto the plane normal to the OA of the spherical lens.

Using the arrangements and techniques discussed above, a wide range of chirped grating devices can be produced with unique optical functionality. In particular, the inventors have demonstrated production of a high-power (~1 W), optically pumped, tunable mid-IR laser (3-5 µm) based on type-II InAs:GaSb active regions. This broad tuning is based on an optically addressed chirped grating fabricated by interferometric lithography (IL) over the large area device (2.5×4 mm$^2$). A quasi-continuous (single longitudinal mode operation spaced by Fabry-Perot steps of a 2.5 mm cavity) tuning range of 65 nm was demonstrated around 3.6 µm. Continuous tuning was achieved across a ~15 nm range, which was limited by the longitudinal chirp of the IL grating. Devices with a lower longitudinal chirp grating, produced using the teachings consistent with aspects of the present disclosure, have been demonstrated with 80 nm of continuous tuning for the same size device. This device was fabricated with a chirped grating using the IL arrangement shown in FIGS. 5 and 6 using a 355 nm 3rd harmonic of a Nd YAG laser, a plano-convex lens with focal length of 51.5 mm. The plano-convex lens was used to convert the approximately planar wave fronts of the two interfering beams to spherical wave fronts converging to two foci behind the photoresist-coated die. The sample was tilted ~45° around the axis x' as shown in FIGS. 5 and 6. The grating period as function of the position on the die is:

$$\Lambda = \frac{\lambda}{\sqrt{\frac{(x'+H)^2+y'^2+D^2\sin^2\beta}{(x'+H)^2+y'^2+D^2} + \frac{x'^2-H^2+y'^2+D^2\sin^2\beta}{\sqrt{(x'+H)^2+y'^2+D^2}\sqrt{(x'-H)^2+y'^2+D^2}} + \frac{(x'-H)^2+y'^2+D^2\sin^2\beta}{(x'-H)^2+y'^2+D^2}}} \quad (1)$$

where λ is the 355-nm interferometric lithography laser wavelength; x',y' are the coordinates on the die. H is the half separation between the two foci as function of the incident beam angles and D is a function related to distance from the two foci to the back surface of the plano-convex lens, the projection in the lens optical axis direction of the coordinates on the die, and its distance to die origin. β is the die tilt angle.

After IL patterning of the photoresist, the pattern is transferred into the GaSb top clad of the epitaxial semiconductor waveguide structure using ICP to a depth of ~500 nm, as shown in FIG. 9A. Then die is thinned down to about 150 µm. A 4×2.5 mm$^2$ device, as shown in FIG. 9B] is cleaved from the center of the die. The lateral dimension of 4 mm is picked to give as wide as possible tunable range without having cracking issues from non-uniform thermal expansion due to local heating from the pump laser. The longitudinal dimension of 2.5 mm is chosen to optimize the coupling strength (KL~1.1) without inducing excessive strain, which could lead to cracking of the sample, as the sample is cooled to 77K. This also allows comparison with previous devices that were cleaved to the same dimensions. The final step is indium mounting the device onto a gold-coated copper heat sink and mounting it to the cold finger of liquid nitrogen (LN) Dewar. The grating period is in the range of 410- to 420-nm, corresponding to a tunable lasing range of 3060- to 3140-nm with effective refractive index of ~3.72. The laser is operated under a ~2.5× threshold pumping condition. To avoid the Fabry-Perot (F-P) modes from facet feedback, the die was intentionally rotated ~6° azimuthally about its normal so that the orientation of grating is tilted relative to the device facets. A CW 1.908 µm thulium fiber laser is used as for optical pumping. The pumping stripe is formed with a cylindrical lens after the fiber output. All the characterization was done with pumping stripe normal to the orientation of grating (and at 6° to the facets). This successfully suppressed the F-P modes, as shown in the following figures.

Figure 10:
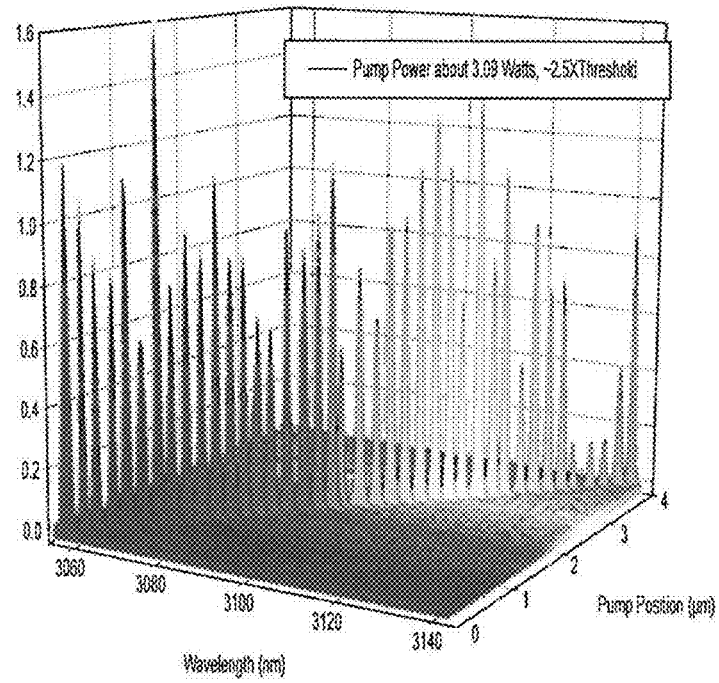
FIG. 10 shows an example waterfall plot of tunability measure done at about 2.5×threshold for the example device.
Figure 11:
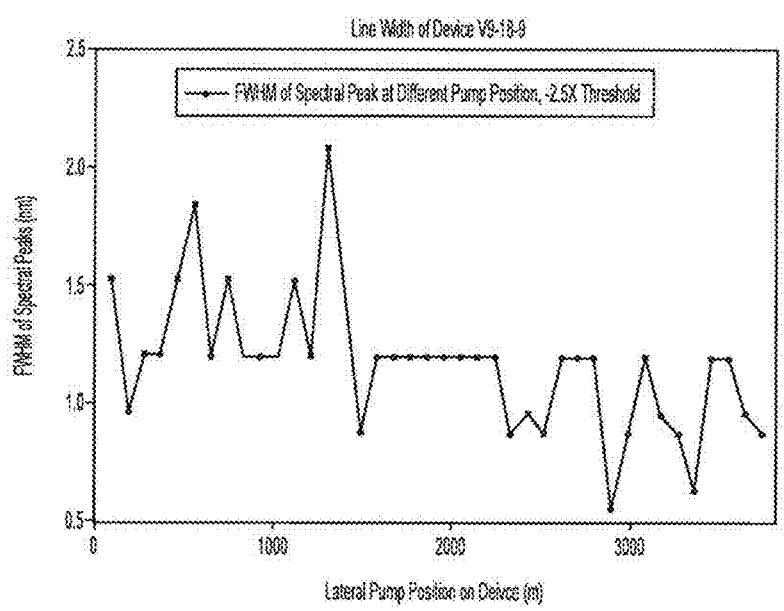
FIG. 11 shows tunability measurement result of the example device. Measurement is done at about 2.5×threshold. The curve with dots is the raw data and the other curve is the quadratic fitting of the raw data which represents the theoretical tunability of the device.
Figure 12:
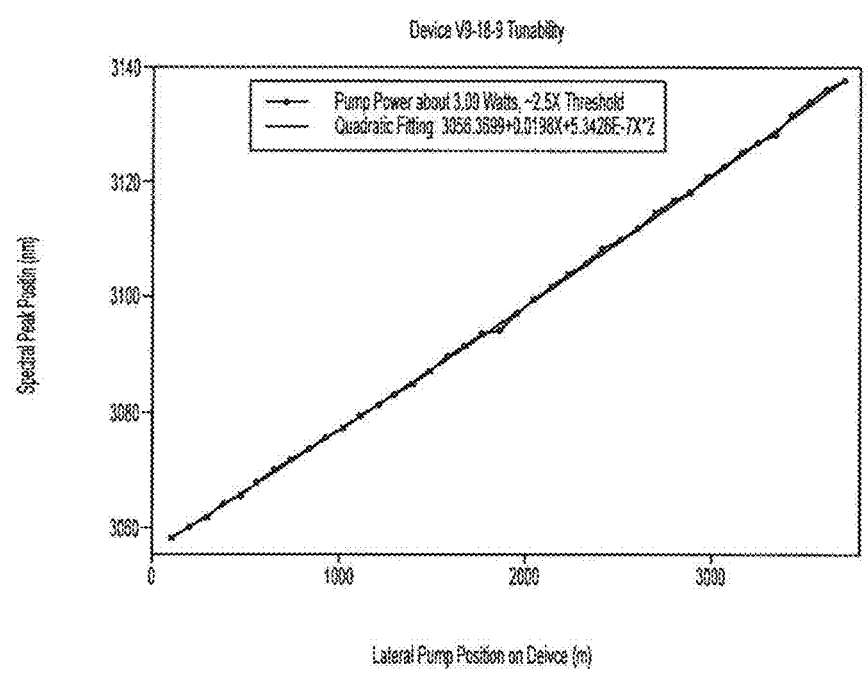
FIG. 12 shows spectral linewidth of the example device in tunability measurement.

The device has been found to operate stably with successful suppression of the F-P modes as shown in FIGS. 10 and 11. The device shows a tunable range of 80 nm from 3058- to 3138-nm at a pump level of 3.0 W, about 2.5×threshold, as shown in FIG. 12. A fine tunability test was carried out by shifting the pump stripe in small increments of about 12.4 µm perpendicular to the chirp direction. The spectral peak wavelength change is less than the F-P mode spacing, of the order of 0.5 nm throughout the tuning range, though there are few bad spots with wavelength jump over 0.5 nm, likely due to process-induced sample damage. In FIG. 11, a single facet output power curve is shown. The output power is still limited by the available pump power. The laser only operates in a DFB configuration with the pump stripe normal to the grating lines, no F-P lasing is observed when the pump stripe is rotated to facet normal.

It is noted that by increasing the tilt angle of the sample, the lateral chirp can be increased to get a wider tunable range without increasing the longitudinal chirp. This will make a tunable range of over 100 nm or more possible for a 4 mm high tunable DFB device.

Methods are discussed that allow fabrication of a chirped grating for type-II optically pumped tunable DFB laser which gives 80 nm tunable range with about 500 mW pump-limited single sided output power has been presented. Methods are discussed that allows patterning of a grating with a larger lateral chirp but smaller longitudinal chirp. The fabricated device achieved a continuous tunable range of 80 nm from about 3060- to 3140-nm across a 4 mm wide device. This is compared with a continuously tunable range of only 15 nm in the devices reported in the first quarter, a major improvement.

By using the present techniques, a lateral chirp can be produced of about 11 nm across 4-mm distance, compared with previous value of less than 2 nm for the low chirped devices. The longitudinal chirp value can be lowered by over 50% to less than 0.1 nm in 2.5 mm distance.

Figure 13:
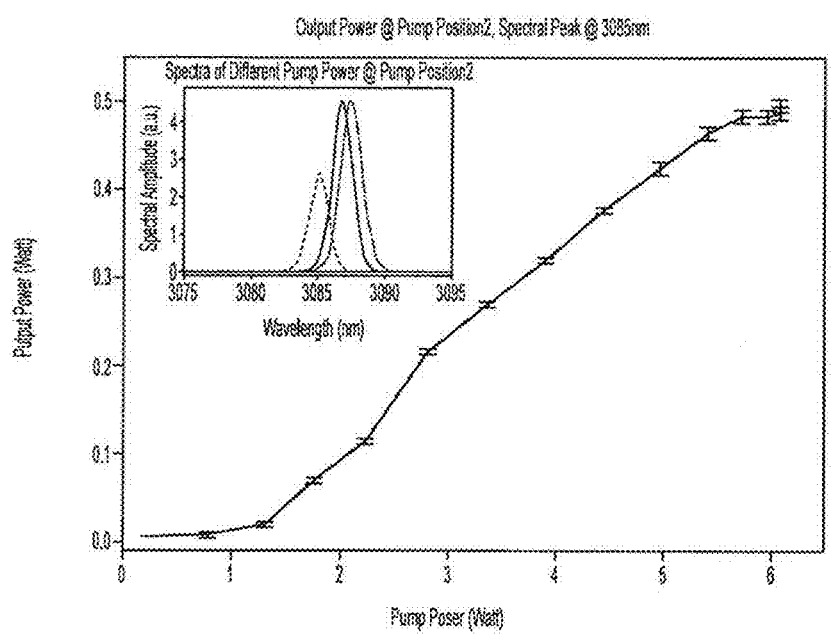
FIG. 13 shows output power of the device at specific pump position as function of pump power. As shown in the figures, output power increase linearly proportional to the pump power. The inset of the figure shows the spectra acquired at different pump powers corresponding to the different colored dots on the output power curve.

FIG. 13 shows the output power of the device at specific pump position as function of pump power. As shown in the FIG. 13, output power is linearly proportional to the pump power. The output power is still limited only by the available pump power and does not roll over. The inset of FIG. 13 shows the spectra acquired at different pump powers corresponding to the different colored dots on the output power curve. Across the whole range of pump power, device lasers in single longitudinal mode, shown in the inset of FIG. 13.

Figure 14:
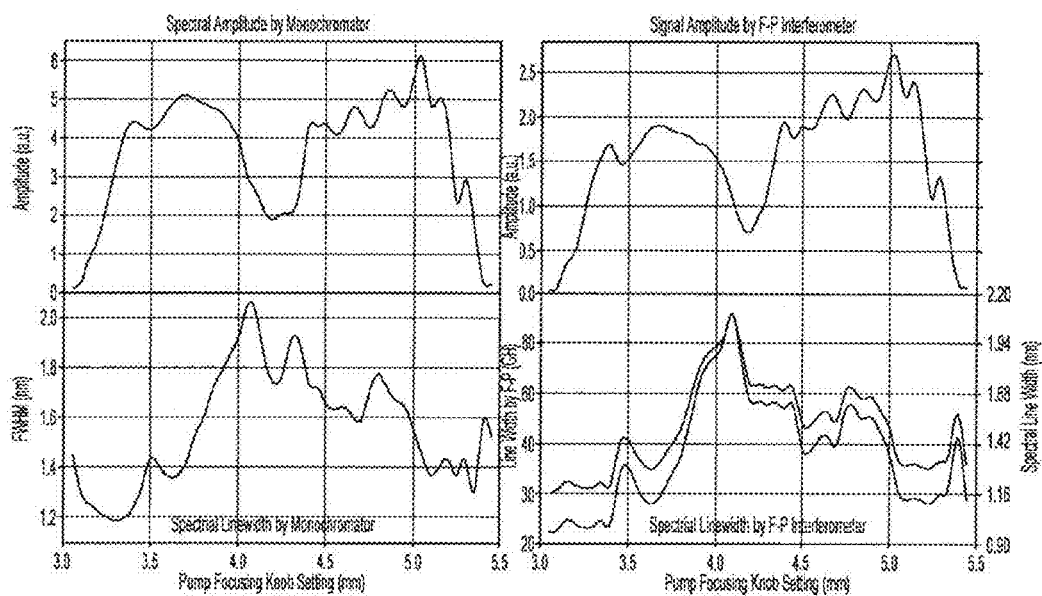
FIG. 14 shows DFB laser output amplitude and spectral linewidth as function of pump stripe focusing.

FIG. 14. shows the DFB laser output amplitude and spectral linewidth as function of pump strip focusing for the device. DFB laser output amplitude and spectral linewidth measured by monochromator and F-P interferometer while adjusting the pump stripe focusing are shown. The output amplitude and spectral line width is pump focusing dependent. The dip in the middle of spectral peak amplitude plot could correspond to the tightest focusing condition. On one side the laser output amplitude tends to be stable and has relative lower spectral linewidth as well. In comparison, on the other side of tightest focusing position, output amplitude fluctuates. Spectral linewidth also gets slightly wider. This could be due to the need to defocus a little bit and pick the correct side (left side in figures, corresponding focusing into substrate side) to get narrowest spectral line width. Right now, what we do is find the maximum amplitude focusing position as the optimized focusing. In case the device moves in/out of optimized focusing condition while it's shifted up/down for tuning purpose, focusing compensation can be added in the experimental setup to have narrowest linewidth as possible for spectroscopy.

Figure 15:
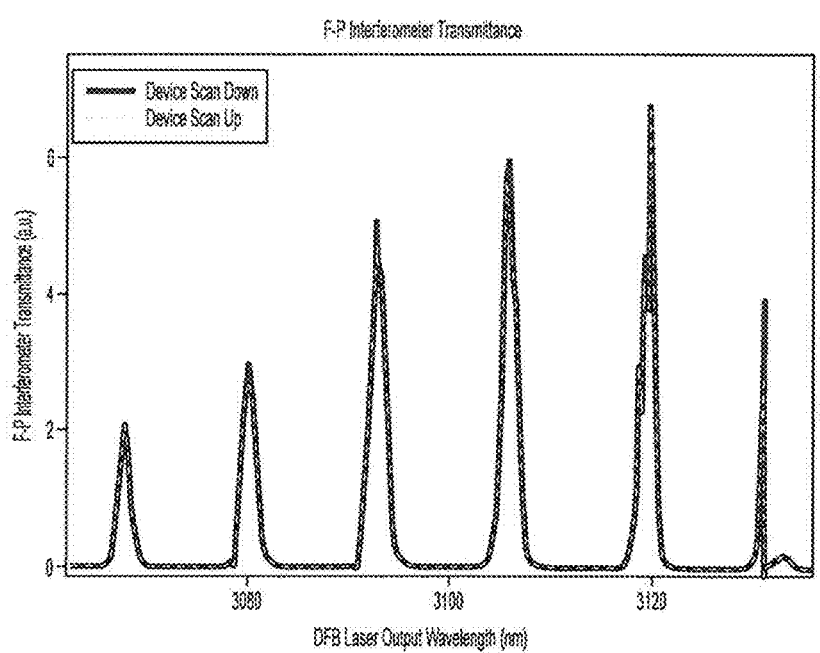
FIG. 15 shows transmittance of F-P Interferometer with fixed cavity length.
Figure 16:
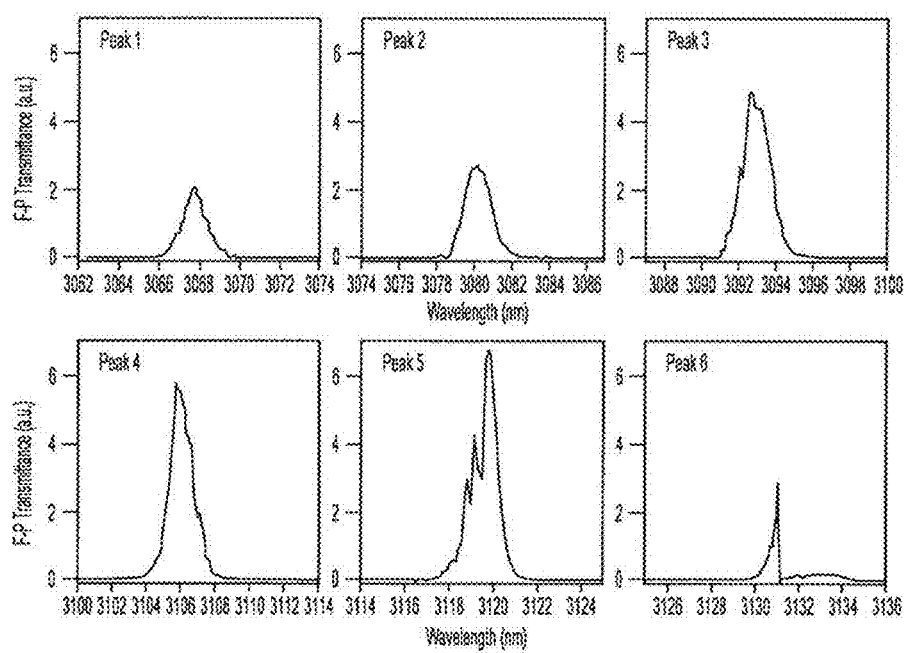
FIG. 16 shows transmittance peaks plotted separately in the FIG. 15.

FIGS. 15 and 16 show plots for an F-P interferometer as artificial target gas for test of device tunability and spectral line width. FIG. 15 shows the transmittance of F-P Interferometer with fixed cavity length. FIG. 16 shows the transmittance peaks plotted separately from FIG. 15. In FIG. 15, the top figure in two is the transmittance measurement of F-P interferometer with fixed cavity length when we tune the DFB laser. The curve is the result when shift DFB device down, and the solid line is for the scan reverse scab (device moved up). Across the lateral dimension of almost 4 mm, we can see 6 peaks, corresponding to six sequential F-P modes as shown in figure. Peak 6 does not look good because the pump stripe is toward the very end of the device with bad fabrication/cleaving quality.

The free spectral range of the F-P interferometer in this test is about 411 GHz (cavity length of about 365 µm). During the tuning of DFB laser, pump focusing knob setting at 4.6 mm, corresponding to a spectral linewidth of about 45 GHz as shown in the FIG. 14. Calibrated by the previous tunablity test of the device, each data point in the plot corresponds to a stepper motor motion of 50 steps which shifts the device about 3.15 µm, equivalent to a wavelength change of about 0.063~0.071 nm. Considering the mirror reflectance of F-P interferometer is about 98.5% in this range, the finesse is about 208 and the smallest resolvable wavelength difference is about 0.063 to 0.065 nm across the whole scan range. Multi-longitudinal operation was not observed in this device. Given all of the above, we think the sub-peaks showing on the shoulder in peak 5 and peak 3, 4 are real and due to existing lateral modes in laser output because the pump strip width in this case should be ≥70 µm.

This conclusion correlates to the spectral linewidth plot by F-P interferometer in FIG. 23a, in which the fluctuation in output amplitude and wider spectral linewidth are because of existing lateral modes.

FIG. 17A shows single facet output power of DFB laser at different pump positions. FIG. 17B shows the spectra at these three different pump positions. At different pump positions, before output power measurement, pump focusing is optimized. Since the new method of grating patterning has less longitudinal chirp, which could also be understood as having longer effective cavity length, the output power is much higher than previous devices. At different pump positions, the output power does not follow the same trend, partially because the bad fabrication.

In addition to the tunable laser application, there are other optical devices where a controlled two-dimensional chirped grating is desired. Another application would be for a the focal plane array detection, where plasmonic effects can be are used to couple specific wavelengths into each pixel of the focal plane.

Another application is for a wavelength multiplexer where it is desired to couple different optical beams into a common propagation path (for example, a waveguide) or a demultiplexer that provides the opposite function of separating multiple wavelengths from a common propagation path. A simple unchirped grating will provide this function, but for a large range of wavelengths, it can be desirable to restrict the angular range that needs to be accessed using necessitates a chirped grating structure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group. As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus for producing an interference pattern on a photosensitive portion formed on a surface of a sample, the apparatus comprising:
    an optical system for providing interference between two coherent spherical wavefronts impinging on a thin-film photosensitive material formed on the surface of the sample, wherein a surface normal of the sample is arranged at an angle greater than 0° with respect to a plane defined by center propagation vectors of the two coherent spherical wavefronts; and
    one or more actuating elements operable to rotate one or more optical elements in the optical system, the sample, or both the one or more optical elements and the sample in one or more degrees of freedom to control a relative magnitude of a longitudinal and a transverse chirp of the interference pattern,
    wherein the optical system comprises:
        a laser with an output beam characterized by both a longitudinal and a transverse coherence;
        one or more optical elements operable to expand and approximately collimate the output beam of the laser,
        wherein a first portion of the output beam of the laser that has been expanded and collimated is incident on a first optical element of the one or more optical elements and is redirected therefrom as a first plane wave to a second optical element of the one or more optical elements at an first angle of incidence,
        wherein a second portion of the output beam of the laser that has been expanded and collimated is incident on the second optical element of the one or more optical elements as a second plane wave at a second angle of incidence,
        wherein the second optical element of the one or more optical elements is the final optical element and is operable to convert the first and the second plane waves into two spherical waves, wherein a center portion of each spherical wave is propagating in a same direction as the first and the second plane waves,
        wherein the two spherical waves interfere coherently to expose a pattern in the thin-film photosensitive material on the surface of the sample, wherein the surface normal of the sample is arranged at the angle with respect to a plane defined by the center propagation vectors of the two coherent spherical wavefronts,
        wherein the interference pattern that has been exposed is characterized by a longitudinal and a transverse chirp, and
        wherein the relative magnitudes of the longitudinal and transverse chirp can be controlled by adjusting the positions and tilts of the one or more optical elements and the sample.

2. The apparatus of claim 1, wherein the second optical element comprises a lens comprising a spherical lens or a cylindrical lens.

3. The apparatus of claim 1, further comprising a supporting structure operable to support the first optical element, the second optical element and the sample.

4. The apparatus of claim 3, wherein the supporting structure comprises one or more actuating elements to adjust the first optical element, the second optical element and the sample in one or more degrees of freedom.

5. The apparatus of claim 1, further comprising a filter arranged between the second optical element and the sample.

6. The apparatus of claim 5, wherein the filter comprises a graded intensity filter operable to compensate for changes in intensity of the output beam produced by the laser and the one or more optical elements.

7. A method of imaging an interference pattern on a photosensitive portion formed on a surface of a sample, the method comprising:
    arranging an optical system for providing interference between two coherent spherical wavefronts impinging on a thin-film photosensitive material formed on the surface of the sample, wherein a normal to the surface of the sample is arranged at an angle greater than 0° with respect to a plane defined by center propagation vectors of the two coherent spherical wavefronts; and
    controlling one or more actuating elements to rotate one or more optical elements in the optical system, the sample, or both the one or more optical elements and the sample in one or more degrees of freedom to control a relative magnitude of a longitudinal and a transverse chirp of the interference pattern,
    wherein arranging the optical system comprises:

providing a laser with an output beam characterized by both a longitudinal and a transverse coherence;

expanding and collimating the output beam of the laser using one or more optical elements, wherein a first portion of the output beam of the laser that has been expanded and collimated is incident on a first optical element of the one or more optical elements and is redirected therefrom as a first plane wave to a second optical element of the one or more optical elements at an first angle of incidence, wherein a second portion of the output beam of the laser that has been expanded and collimated is incident on the second optical element of the one or more optical elements as a second plane wave at a second angle of incidence, wherein the second optical element of the one or more optical elements is the final optical element and is operable to convert the first and the second plane waves into two spherical waves, wherein a center portion of each spherical wave is propagating in a same direction as the first and the second plane waves, wherein the two spherical waves interfere coherently to expose a pattern in the thin-film photosensitive material on the surface of the sample, wherein the surface normal of the sample is arranged at the angle with respect to a plane defined by center propagation vectors of the two coherent spherical wavefronts, wherein the interference pattern that has been exposed is characterized by a longitudinal and a transverse chirp, and wherein the relative magnitudes of the longitudinal and transverse chirp can be controlled by adjusting positions and tilts of the one or more optical elements and the sample.

8. The method of claim 7, wherein the second optical element comprises a lens comprising a spherical lens or a cylindrical lens.

9. The method of claim 7, further comprising providing a supporting structure to support the first optical element, the second optical element, and the sample.

10. The method of claim 9, wherein the supporting structure comprises the one or more actuating elements to adjust the first optical element, the second optical element and the sample in one or more degrees of freedom.

11. The method of claim 7, further comprising providing a filter between the second optical element and the sample.

12. The method of claim 11, wherein the filter comprises a graded intensity filter operable to compensate for changes in intensity of the output beam produced by the laser.

13. The method according to claim 7, wherein the laser comprises a frequency tripled Nd:YAG laser.

14. A device formed by the method of claim 7, wherein the device comprises an optically pumped, tunable mid-IR laser based on type II-InAS:GaSb material.

* * * * *